United States Patent
Broberg et al.

(10) Patent No.: US 8,156,454 B2
(45) Date of Patent: Apr. 10, 2012

(54) VIRTUAL DATA REPRESENTATION THROUGH SELECTIVE BIDIRECTIONAL TRANSLATION

(75) Inventors: Robert N. Broberg, Rochester, MN (US); George W. Nation, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 599 days.

(21) Appl. No.: 12/201,575

(22) Filed: Aug. 29, 2008

(65) Prior Publication Data

US 2009/0007042 A1  Jan. 1, 2009

Related U.S. Application Data

(62) Division of application No. 10/995,777, filed on Nov. 23, 2004, now Pat. No. 7,434,180.

(51) Int. Cl.
G06F 17/50 (2006.01)
(52) U.S. Cl. ........................ 716/103; 716/102
(58) Field of Classification Search ........... 716/100–104
See application file for complete search history.

(56) References Cited

U.S. PATENT DOCUMENTS

| | | | | |
|---|---|---|---|---|
| 5,852,733 A | 12/1998 | Chien et al. | ................ | 395/701 |
| 5,920,711 A | 7/1999 | Seawright et al. | ............ | 395/500 |
| 6,208,345 B1 | 3/2001 | Sheard et al. | ................ | 345/356 |
| 6,282,699 B1 | 8/2001 | Zhang et al. | ................ | 717/2 |
| 6,408,428 B1 * | 6/2002 | Schlansker et al. | ........... | 716/104 |
| 6,513,144 B1 | 1/2003 | Kim et al. | | |
| 6,557,145 B2 | 4/2003 | Boyle et al. | ................ | 716/2 |
| 6,581,187 B2 * | 6/2003 | Gupta et al. | ................ | 716/103 |
| 6,609,130 B1 * | 8/2003 | Saulpaugh et al. | ........... | 717/116 |
| 6,625,780 B1 * | 9/2003 | Charbon et al. | ............. | 716/103 |
| 6,625,797 B1 | 9/2003 | Edwards et al. | | |
| 6,631,519 B1 * | 10/2003 | Nicholson et al. | ............ | 717/169 |
| 6,671,869 B2 | 12/2003 | Davidson et al. | ............... | 716/17 |
| 6,877,150 B1 | 4/2005 | Miller et al. | | |
| 6,901,403 B1 | 5/2005 | Bata et al. | ................ | 707/101 |
| 6,934,712 B2 | 8/2005 | Kiernan et al. | ............... | 707/102 |
| 2004/0221003 A1 | 11/2004 | Steele et al. | ................ | 709/203 |

OTHER PUBLICATIONS

Krishna, B. and Kleinfield, G.; "Circuit Design Environment and Layout Planning," *Intel Technology Journal Q1'99*, pp. 1-8.
Eurich, J. and Roth, G.; "EDIF Grows Up," IEEE Spectrum, Nov. 1990, pp. 68-72.
Martin, H. and Ranjani, R; "A CAD Tool for Circuit Extraction from VLSI Layout Cells," IEEE Proceedings Session 12A1,1989,pp. 949-952.
T.H. Ooi et al.; "Netlist Complier for ASIC Design on a Personal Computer," *Computer Aided Engineering Journal*, Oct. 1991,pp. 200-204.
"XML as a Processor Description Language for High Level Design Space Exploration," 2000,pp. 1-6.

* cited by examiner

*Primary Examiner* — Jack Chiang
*Assistant Examiner* — Binh Tat
(74) *Attorney, Agent, or Firm* — Alan G. Rego; Westman, Champlin & Kelly, P.A.

(57) ABSTRACT

A computer-aided circuit design application has a virtual node feature and a design tool. The virtual node feature is adapted to access design specification information in a first data format and to represent the accessed design specification information as a virtual data node object within a list of node objects in a second data format. The design tool is operable on the list of node objects and the virtual data node object.

8 Claims, 5 Drawing Sheets

VIRTUAL DATA REPRESENTATION THROUGH SELECTIVE BIDIRECTIONAL TRANSLATION

CROSS-REFERENCE TO RELATED APPLICATION

This application is a divisional of and claims priority from U.S. patent application Ser. No. 10/995,777, filed Nov. 23, 2004, the contents of which are incorporated herein by reference in their entirety.

FIELD OF THE INVENTION

The present invention relates to design tools for use in designing integrated circuits, and more particularly, to computer-aided design tools adapted to produce an integrated circuit layout pattern from multiple data sources.

BACKGROUND OF THE INVENTION

Semiconductor integrated circuits are traditionally designed and fabricated by first preparing a schematic diagram for hardware description language (HDL) specification of a logical circuit in which functional elements are interconnected to perform a particular logical function. With standard cell technologies, for example, the schematic diagram or HDL specification is synthesized into standard cells of a specific cell library.

Each cell corresponds to a logical function unit or module, which is implemented by one or more transistors that are optimized for the cell. The logical designer selects the cells according to the number of loads that are attached at the cell, as well as an estimated interconnection required for routing. The cells in the cell library are defined by cell library definitions. Each cell library definition includes cell layout definitions and cell layout characteristics. The cell layout definition includes a layout pattern of the transistors in the cell, geometry data for the cell's transistors and cell routing data. The cell characteristics include a cell propagation delay and a model of the cell's logical function. The propagation delay is a function of the internal delay and the output loading (or "fan-out") of the cell.

A series of computer-aided design tools generates a netlist from the schematic diagram or HDL specification for the selected cells and the interconnections between the cells. The netlist can be used by a floor planner or a placement tool to place the selected cells at particular locations in an integrated circuit layout pattern. The interconnections between the cells are then routed along predetermined routing layers. The design tools then determine the output loading of each cell as a function of the number of loads attached to each cell, the placement of each cell, and the routes of the interconnections.

Conventionally, computer-aided, integrated circuit design tools utilize proprietary cell libraries, which include cell information, such as cell layout, timing, and signal routing information. Often, the layout design flow involves more than one design tool. Each such design tool can come from a different company. In such instances, the cell layouts created and/or utilized by such design tools may contain layout descriptions in different file formats and at different stages (e.g. logic design stage, circuit design stage, layout design stage, and so on) within the design layout process. For example, timing information, clocks, clock frequency parameters, input/output pins, attachment pad parameters, and so on, are often stored in different places and in different formats within the cell libraries of different design applications. Conventionally, if a cell module is created in one design tool that is needed or is to be used in an integrated circuit layout pattern produced by a second design tool, a decision has to be made with respect to conversion. Typically, a winner is chosen from the various design tools and all cells or cell libraries and related information are converted to the format of the "winning" design tool. Alternatively, one or more of a series of design tools are adapted to communicate with one another, and cell definitions are translated for use in other tools of the layout process.

The various formats of the layout information inhibit interactive design and potentially cause problems for design tools with respect to maintaining data consistency during the design cycle. Moreover, different design tools provide inconsistent user interfaces, meaning that a designer must either be familiar with multiple design tool interfaces, or the different tools must be operated by different designers. In the latter case, the design flow is partitioned among different engineers, each of which focuses on local optimizations, which may inhibit overall design optimization. Finally, if multiple design tools are utilized, iterations of timing and/or design optimization may introduce significant delays in the design process.

There is an ongoing need for systems and methods for communicating integrated circuit layout information between unrelated systems.

SUMMARY OF THE INVENTION

A computer-aided circuit design application has a virtual node feature and a design tool. The virtual node feature is adapted to access design specification information in a first data format and to represent the accessed design specification information as a virtual data node object within a list of node objects in a second data format. The design tool is operable on the list of node objects and the virtual data node object.

A system for computer aided design of an integrated circuit layout is described. A list of nodes represents data in a first format. A virtual node feature is adapted to represent information from one or more data files in a native file format as virtual nodes in the list of nodes. A design tool is adapted to traverse the list to access selected information.

In another embodiment, a system for producing a circuit layout includes a circuit design file and a design tool. The circuit design file is in a first file format and has embedded tags identifying information types. At least one of the embedded tags is a virtual data node representative of data in a native file format. The design tool is adapted to process the circuit design file by populating the embedded tags with information. The design tool is adapted to process the virtual data node by accessing data in a native data file referenced by the virtual node and by merging the accessed data into the design file.

DETAILED DESCRIPTION OF ILLUSTRATIVE EMBODIMENTS

Figure 1:
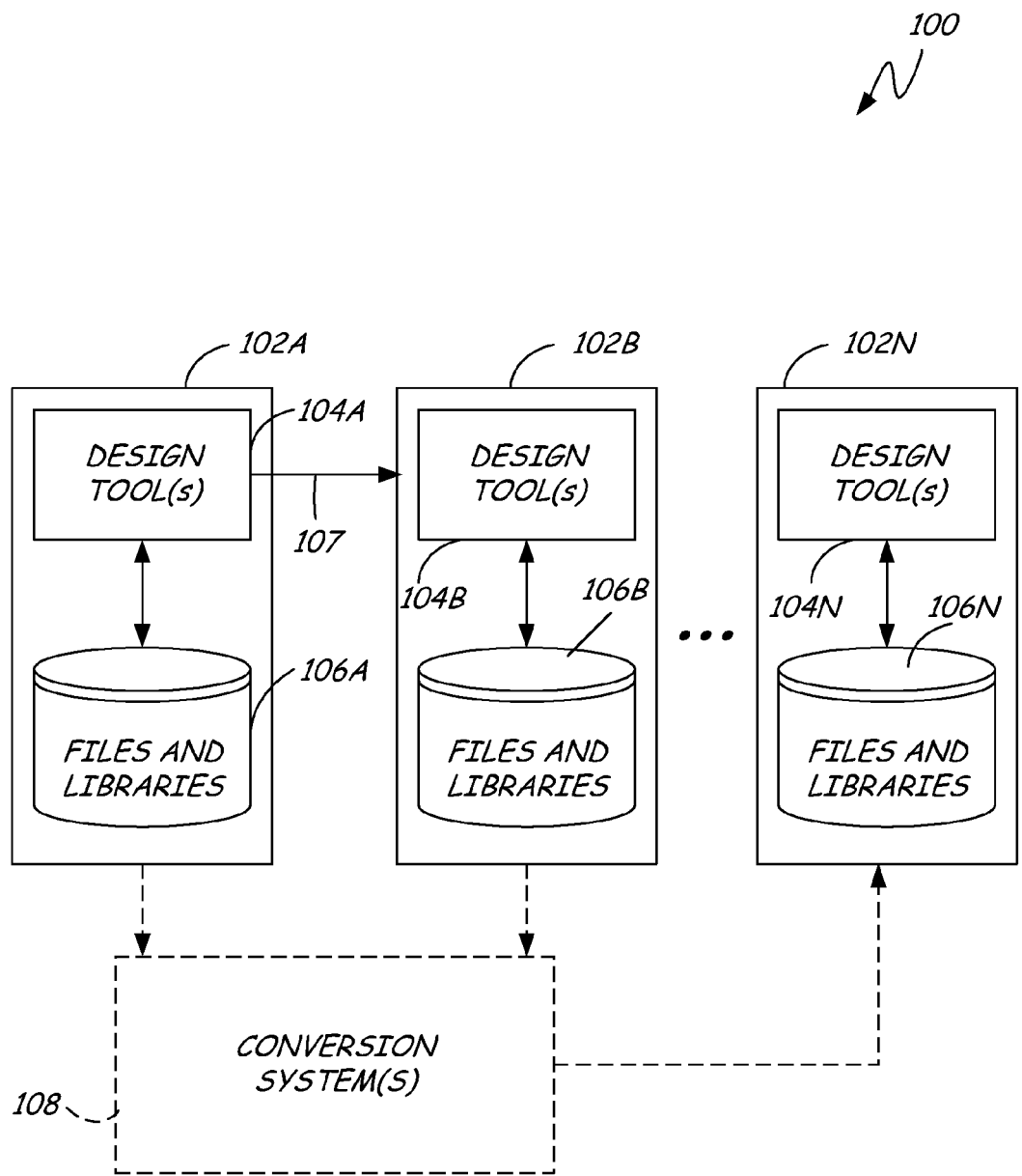
FIG. 1 is a simplified block diagram of a conventional integrated circuit design suite of tools.

FIG. 1 is a simplified block diagram of a conventional system 100 for designing an integrated circuit layout. The system 100 includes a plurality of integrated circuit design applications 102A-102N, each design application 102 including one or more design tools, such as design tools 104A-104N, and one or more libraries, such as files and libraries 106A-106N (sometimes referred to as "databases").

Arrow 107 illustrates a capability of direct communication between design applications 102A and 102B, such as via a standardized file formats or proprietary software routines for translating between the applications. Alternatively, design applications 102A and 102B may be from the same vendor and therefore share a common file format, enabling communication between the applications 102A and 102B. However, neither application 102A nor 102B is adapted to communicate with design application 102N. Thus, the files and libraries 106A and 106B cannot be utilized directly by design tool 104N of design application 102N.

The libraries 106A and 106B are first converted to a format compatible for use with the design application 102N by one or more conversion systems 108. In this instance, to utilize cell layouts and parameters from design applications 102A and 102B, the information is converted by conversion systems 108 to the format of the "winning" design application 102N. Conversion systems 108 are shown in phantom because the conversion systems 108 may be included in the winning design application 102N, may be included within each of the design applications 102A-102N to convert the cell layout and parameters to a standardized format, or may be a stand-alone conversion application.

Figure 2:
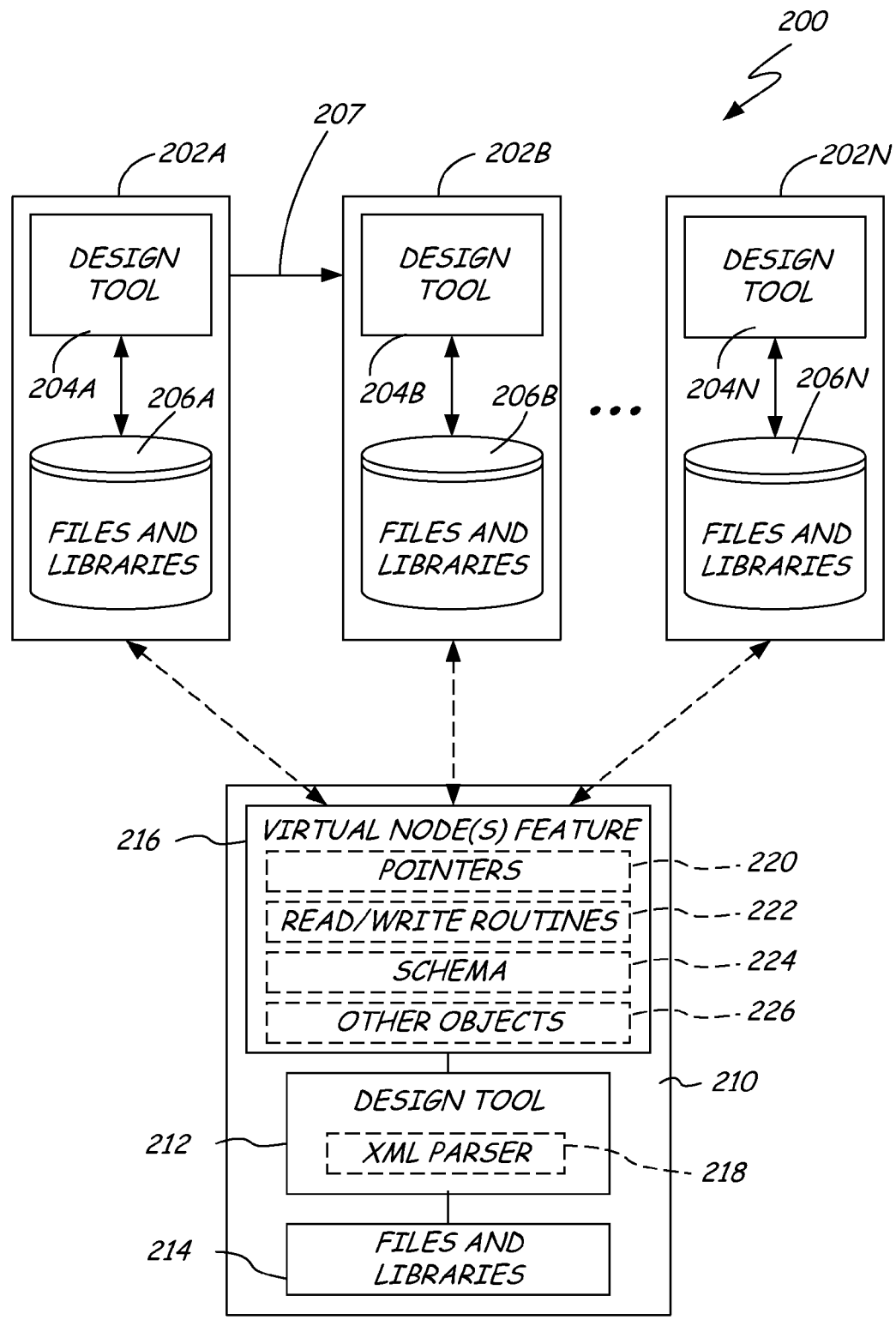
FIG. 2 is a simplified block diagram of an integrated design tool having a virtual node according to an embodiment of the present invention.

FIG. 2 illustrates a system 200 for designing integrated circuit layout patterns according to an embodiment of the present invention. The system 200 includes a plurality of computer-aided integrated circuit design applications 202A-202N, each of which includes one or more design tools (such as design tools 204A-204N) and one or more data files (such as files and libraries 206A-206N). The system 200 also includes an integrated circuit design application 210 having one or more design tools 212 and one or more data files, such as files and libraries 214. The design tools 212 preferably include a virtual data node feature 216 adapted to function with one or more virtual data nodes. In one embodiment, the design tools 212 include an XML parser 218 adapted to access information contained in XML files or libraries.

The virtual nodes feature 216 provides a means for direct access to the native file data by the design tools 212. The virtual nodes feature 216 is adapted to "virtualize" data contained in files and libraries 206A-206N as virtual node objects with direct access to information contained in the files and libraries 206A-206N in their native file formats, without converting the data. The term "virtualize" refers to a process whereby the virtual nodes feature 216 produces a virtual node object that contains information about data in a native or proprietary file format. Such information may include pointers 220 to the location of the files and/or libraries (such as legacy data from other systems), routines 222 for reading from and writing to the selected files and/or libraries, and other objects 226 for manipulating the files and/or libraries in XML operations (such as no cache write functions, cache read features, schema 224, and the like). Generally, schema 224 refers to the rules and dictionary for using tags in a markup language, such as XML. The schema 224 can validate XML files, and is adapted to work with legacy readers and writers to validate contents/data for the virtual nodes feature 216 within each virtual node. Moreover, the schema 224 provides a means for updating data within the virtual nodes, the layout pattern, and the legacy data files, by synchronizing updates across the design suite through the virtual nodes feature 216. During a circuit design process, as design layout descriptions penetrate the virtual data node to access selected information, the virtual nodes feature 216 utilizes the information of the virtual node object to access and translate selected portions of the information from the files and libraries 206.

The virtual nodes feature 216 represents the native file data as a virtual data object in a format expected by the design tool 212. This allows the design tools 212 to utilize data, such as that stored in files and libraries 206A-206N, from different file formats and from both legacy systems (such as existing EDA tools and database programs) and new design tools. Moreover, the virtual nodes feature 216 allows for existing tool re-use, which both broadens the design space and reduces development time by allowing re-use of tool chains developed for other processors. The virtual nodes feature 216 permits the design application 212 to access data in parallel across modes, across design applications (202A-202N), and in the native file format. When the design tool 212 needs the information, the tool 212 can automatically step through the virtual data nodes provided by the virtual nodes feature 216 to retrieve the actual data.

In general, the design tools 212 are adapted to assemble an integrated circuit layout pattern, and to represent cell layout, timing and other information in a layout description based on the files and libraries 214 and the virtualized data accessible via the virtual node feature 216.

In one embodiment, the layout description is represented as a tree of linked nodes, which the design tool accesses, modifies and synthesizes into a layout pattern. Generally, information from libraries 214 is represented as one or more nodes of the tree, and data associated with libraries 206A-206N can be virtualized into virtual data objects by the virtual node feature 216 as needed. The virtual data objects can be added as virtual nodes to the tree of linked nodes. Data represented by each of the nodes of the tree of linked nodes can be updated using the design application 210. Updates and modifications made to data represented in the virtual nodes can be saved to the native data file formats, because the virtual nodes feature 216 is adapted to refer to programs for reading/writing data of that format.

In a preferred embodiment, the design application 210 utilizes EXtensible-Markup Language (XML) as a data format for cell layout and parameter data contained in the libraries, in part, because XML is an open standard. XML is a markup language much like Hyper-Text Markup Language (HTML). XML was designed to describe data. Tags in XML can be used to identify information within a document or file, such as a cell library. Additionally, XML tags are not necessarily fixed, meaning that tag definitions may be readily created by the designer. XML uses a document type definition (DTD) or an XML Schema to describe the data. XML with a DTD or XML schema is designed to be self-descriptive. Design tools 212 preferably utilize XML as the data format because of XML's compatibility with other implementations (such as HTML) and because XML is an open standard, so data is often migrated between proprietary legacy formats.

The XML parser 218 (shown in phantom) can be used to load an XML document, such as a cell library, into memory on a computer, for example. Once the XML document is loaded, information contained within the XML document can be retrieved and manipulated. In one embodiment, cell libraries are stored in XML documents or files. Additionally, data from proprietary databases can be "virtualized" as XML tagged data, allowing the design tool to access data directly via virtual nodes 216.

The design tool 212 can traverse the node objects of the node tree to retrieve data as needed. Virtual data nodes 216 can be added to the node tree as needed, to represent or host data and attributes associated with a library 206A-206N without requiring the library to be stored in the same format or in the same location as other library data.

In general, the virtual data node feature 216 is described as being part of the design tools 212. However, in some instances, the virtual data node feature 216 can be implemented as, for example, a dynamic link library (DLL), which can be invoked by the design tools 212 to access information in various formats. Additionally, a virtual data node feature 216 can be implemented as a DLL for use with other software applications. For example, the data associated with libraries 206A-206N and libraries 214 can comprise a design specification. As used herein, the term "design specification" refers to data in any electronic format that describes something that is physical, including, for example, circuit modules, cell layouts, timing information and the like. A design specification can also include engineering information, vectorized line drawings, or any type of data set that describes a physical element or object. For example, the libraries can contain data such as files in a CAD format, selected portions of which can be virtualized as a virtual data node by a virtual data node feature for use in an application that otherwise cannot read CAD file formats.

Figure 3:
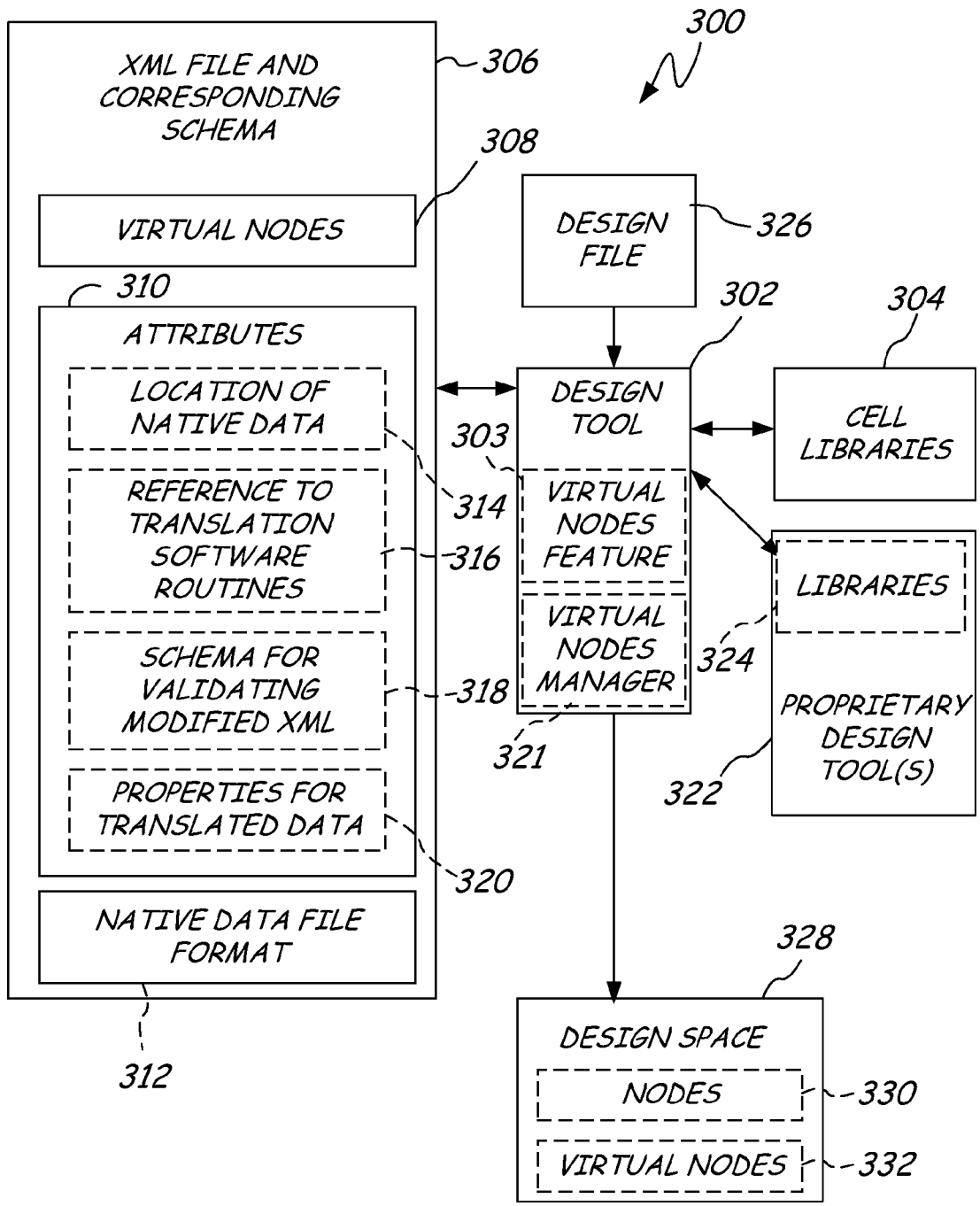
FIG. 3 is an expanded block diagram of a virtual node for use in an integrated circuit design suite of tools according to an embodiment of the present invention.

FIG. 3 shows a simplified block diagram of a structure 300 adapted to enable data virtualization according to an embodiment of the present invention. The structure 300 includes a design tool 302 with a virtual nodes feature 303, libraries 304, and an XML file and corresponding schema 306. The XML file and corresponding schema 306 includes virtual nodes (terminal nodes or XML tags) 308, attributes of each virtual node 310, and native data file format information 312 associated with each node. It should be understood that representation of libraries in different formats can achieved by designating one or more virtual nodes to represent data from the libraries in a design space. Additionally, though the XML file and corresponding schema 306 are shown as a separate block, the XML file and corresponding schema 306 may be part of the design tool 302 or may be provided as input to the design tool, depending on the implementation.

The node attributes 310 include information about the data represented by the node, including a location 314 of data (such as, for example, a path and file name) in a native data format; a reference to one or more software routines 316 adapted to translate the native format file to XML and vice versa; schema 318 for validating modified XML against the native data format; and properties 320 specifying whether the translated data can be cached, written through, or otherwise modified. The native data file format information 312 includes information about how data is stored within a particular library.

The design tool 302 is coupled to libraries 304 and one or more proprietary design tools 322 with associated libraries 324 for producing, for example, an integrated circuit design layout. The design tool 302 can be adapted to receive a design file 326 (such as a netlist), which includes layout information in a standard format. The design tool 302 can then produce a layout design in a design space 328 of the design tool 302 comprised of nodes 330 (corresponding to data contained in libraries 304) and of virtual nodes (corresponding to data contained in libraries 324).

In assembling the layout pattern within the design space 328, the design tool 302 via the virtual nodes feature 303 accesses the XML file and corresponding schema 306, and adds virtual nodes 332 to the design space 328 as needed, based on the design and according to the attributes 310 and native data file format information 312. The design tool 302 can use the location 314 to locate data in a library 324, translate the data into an XML file by accessing translation software routines 316, and validate the translated data using the schema 318. Using the design tool 302, an operator can alter the integrated circuit design layout. Changes to proprietary information can be used to update the proprietary library 324, if the properties 320 allow such updates. Specifically, based on the properties 320, the design tool 302 can utilize the translation software routines 316 to write updated information to the proprietary library 324.

In one embodiment, the design tool 302 includes a suite of design applications, each of which may request access to a virtual node during operation. The design tool 302 can include a virtual node manager 321, which can be part of the virtual nodes feature 303 or can be implemented as a separate function. The virtual nodes manager 321 is adapted to manage access to the virtual nodes, for example, to ensure access to high priority processes and to ensure that data within the virtual node is not changed while another operation is using the information. The virtual nodes manager 321 is preferably adapted to decide when to flush data out to memory (such as the native file format), when to lock a virtual node temporarily, and so on. In one embodiment, the virtual nodes manager 321 can provide functionality similar to processor data cache algorithms, which are typically part of the processor of a host computer system, for example.

Figure 4:
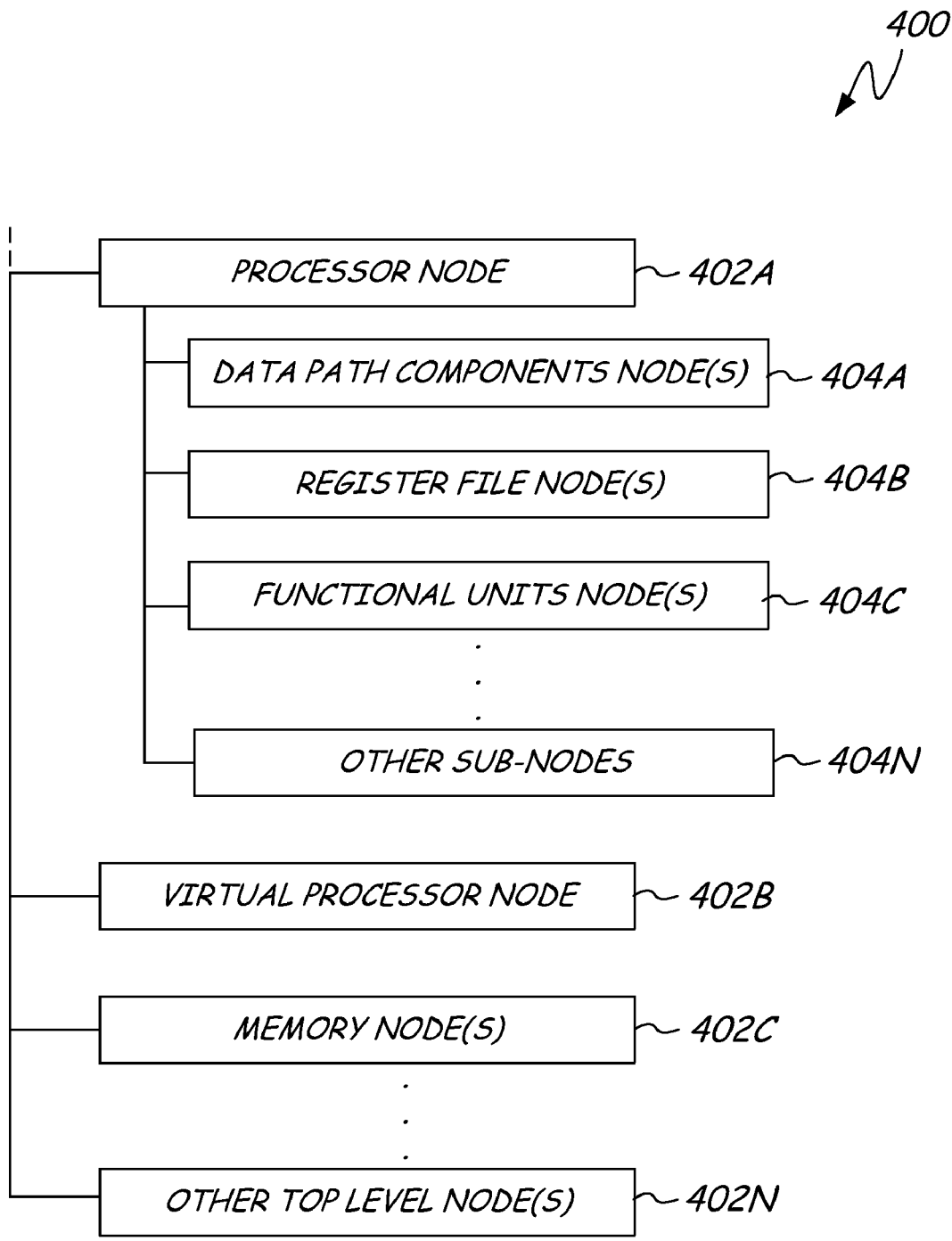
FIG. 4 is a simplified block diagram of a portion of a hierarchical node tree diagram according to an embodiment of the present invention.

FIG. 4 is a simplified block diagram illustrating a portion of a logical node tree 400 assembled in a design space within a circuit design tool according to an embodiment of the present invention. The node tree 400 is provided for illustrative purposes only, in order to illustrate a virtual node object (such as node object 402B) within a larger layout. It should be understood by a worker skilled in the art that the node tree represents information within a computer-aided circuit design application, and does not necessarily represent how information is displayed to an operator of the design application.

Generally, the node tree 400 is comprised of a plurality of top-level nodes 402A-402N, each of which may include one or more sub-nodes 404A-404N, which include additional layout details associated with the particular node 402. In this example, a source node for a processor is a processor node 402A. A file with several processor nodes describes a multi-processor system. The node tree 400 can include several nodes or subnodes to describe data path components, such as clusters, functional units, register files, and the like. Each component of a process can be identified by its corresponding node type and a name identifier (to differentiate between nodes of the same type). Attributes and sub-nodes of a node provide additional information about the component, such as cache memories, and so on.

A memory hierarchy can also be specified as a series of nodes 402C at this level. Connections between memories can be explicitly encoded in the description of each memory, allowing for simple additions of extra memory levels, as well as interconnections, bypasses, and so on.

Generally, the nodes 402 may be specified by a designer, if the designer knows what types of instructions sets are to be used in the layout. However, the virtual node feature of the design tool allows for the instantiation of virtual nodes, such as virtual processor node 402B, for incorporating instructions sets that are independent of the design tool.

Figure 5:
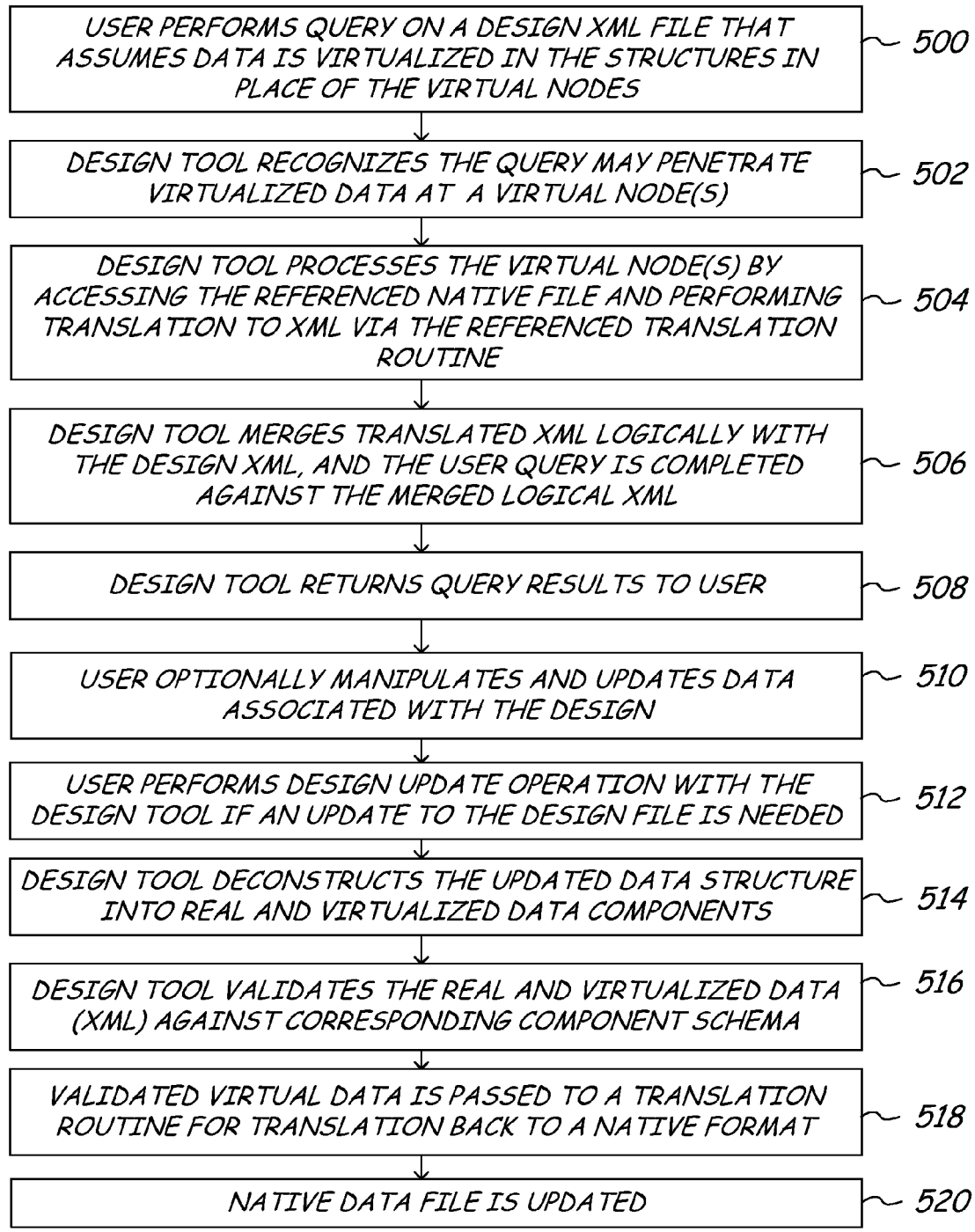
FIG. 5 is a simplified flow diagram of a sequence of operations showing use of a virtual node and reference native data to prepare an integrated circuit pattern according to an embodiment of the present invention.

FIG. 5 is a simplified flow diagram of a method of utilizing a virtual node for preparing an integrated circuit layout pattern based on one or more design tools with native data formats according to an embodiment of the present invention. A user performs a query on a design XML file that assumes data is virtualized in the structures in place of the virtual nodes (Block 500). The design tool processes the query and recognizes that the query may penetrate virtualized data at a virtual node or nodes (block 502). A virtual nodes feature of the design tool processes the virtual node or nodes by accessing the referenced native file and performing the translation to XML via the referenced translation routine (block 504). The resulting translated XML is merged logically with the design XML and the user query is completed against the merged logical XML (block 506). Query results are returned to the user (block 508). The user via an interface optionally manipulates and updates the data (block 510). If an update to the design file is needed, a user may perform an update operation using the design tool (block 512). The design tool then deconstructs the updated data structure into real and virtualized data components (block 514). The design tool, through the virtual nodes feature, validates the real and virtualized data (XML) against corresponding component schema (block 516). Validated virtual data is passed to a translation routine for translation back into the native format (block 518). The native data file may then be updated (block 520).

In some instances, particularly if the design tool includes more than one application which accesses a virtual node, it may be desirable to maintain the virtualized data in a memory cache or buffer, which the various applications can use. The cached version of the virtualized data can then be altered or updated. When the processes are finished or in response to an operator instruction to save changes, the design tool can write the updated data to the native file format via the translation routine. By utilizing a cache, the number of read/write and translation operations can be kept to a minimum, rather than writing each change back to the native format and reading the data from the native format each time it is needed.

The flow diagram shown in FIG. 5 is an example sequence. Variations are possible and expected, and other notable aspects of the design flow can include processing of multiple virtual nodes in the design file. Additionally, translated data and native data may be locked to prevent changes. Generally it is not necessary to translate the entire data file into XML. The translation program and schema specify portions of the native data made available as virtualized data to the design engine or tool. It is not necessary to make the available data at only a single location in the design file. A one-to-one mapping of translation routines to native data files is not necessary. Multiple translation routines can pull out custom views of virtualized data as needed. A one-to-one mapping of translation routines for native file formats is not necessary due to peculiarities in uses of more free-form formats. However, such mappings can be included. Finally, translated data can be cached in the design tool, and the data can be time stamped to maintain its coherence with respect to the native file format.

Although the present invention has been described with reference to preferred embodiments, workers skilled in the art will recognize that changes may be made in form and detail without departing from the spirit and scope of the invention.

What is claimed is:

1. A system for producing a circuit design, the system comprising:
    a circuit design file in a first file format comprising a plurality of nodes representing data in files having respective file formats, including a virtual data node representative of data contained in a native file having a native file format; and
    a design tool adapted to process the circuit design file by accessing the data in the files through the plurality of nodes, wherein the design tool is adapted to directly access the data contained in the native file through the virtual data node, translate the data contained in the native file from the native file format to the first file format and merge the accessed data into the design file,
    wherein the design tool comprises a virtual node feature adapted to virtualize data in the virtual data node and to access selected data in the native file format for populating the virtual data node, and
    wherein the virtual node feature further comprises a schema adapted to use software routines for translating between the native file format and the first file format to translate portions of native file data as needed.

2. The system of claim 1 wherein the virtual node feature further comprises:
    schema adapted to validate modified data in the first file format against data in the native file format if translated data accessed from the native data is altered by the design tool.

3. The system of claim 1 wherein the virtual data node comprises:
    a reference to at least one software routine for translating between the native file format and the first file format.

4. The system of claim 1 wherein the design tool is adapted to process multiple virtual data nodes in the design file.

5. The system of claim 1 wherein the first file format comprises an extensible markup language format.

6. The system of claim 5, wherein the native file format is different from the extensible markup language format.

7. The system of claim 1, wherein the design tool is further adapted to modify the data accessed through the virtual data node, translate the modified data from the first file format to the native file format and update the data contained in the native data file.

8. The system of claim 1, wherein the virtual data node is configured to enable the design tool to access the data contained in the native file without converting the native file from the native file format to the first file format.

* * * * *